United States Patent
Kilibarda et al.

(10) Patent No.: US 11,258,145 B2
(45) Date of Patent: *Feb. 22, 2022

(54) BATTERY AND PROCESS FOR PRODUCING A BATTERY

(71) Applicant: VARTA Microbattery GmbH, Ellwangen Jagst (DE)

(72) Inventors: Goran Kilibarda, Schwaebisch Gmuend (DE); Bernd Kreidler, Ellwangen (DE); Joachim Rieger, Aalen (DE)

(73) Assignee: VARTA MICROBATTERY GMBH, Ellwangen Jagst (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/850,008

(22) Filed: Apr. 16, 2020

(65) Prior Publication Data

US 2020/0373522 A1   Nov. 26, 2020

(30) Foreign Application Priority Data

May 20, 2019   (EP) .................................... 19175460

(51) Int. Cl.
*H01M 50/56* (2021.01)
*H01M 50/109* (2021.01)
(Continued)

(52) U.S. Cl.
CPC ............. *H01M 50/56* (2021.01); *C23C 14/34* (2013.01); *H01M 10/0427* (2013.01);
(Continued)

(58) Field of Classification Search
CPC .... H01M 50/56; H01M 50/109; H01M 50/20; H01M 50/132; H01M 50/15
See application file for complete search history.

(56) References Cited

U.S. PATENT DOCUMENTS

2004/0221446 A1   11/2004   Ohhara et al.
2011/0091753 A1   4/2011   Wang
(Continued)

FOREIGN PATENT DOCUMENTS

CN   101728574 A   6/2010
EP   1505668 A2   2/2005
(Continued)

*Primary Examiner* — Kenneth J Douyette
(74) *Attorney, Agent, or Firm* — Leydig, Voit & Mayer, Ltd.

(57) ABSTRACT

A method for producing a battery includes depositing, via sputter deposition, a coating on at least a portion of a cup shaped first housing part of the battery. The coating includes aluminium, chromium, tin, and/or an alloy having two or more of the group consisting of aluminium, chromium, and tin. The method also includes establishing an electrical connection between a current conductor of the battery and the cup-shaped first housing part of the battery and assembling the cup-shaped first housing part of the battery and a second housing part of the battery to form a housing of the battery. The housing has an interior space that includes a composite body including a positive electrode, a negative electrode, a separator, and the current conductor. The cup-shaped first housing part has a circular or oval bottom and a ring-shaped side wall.

13 Claims, 2 Drawing Sheets

(51) Int. Cl.
*H01M 10/04* (2006.01)
*C23C 14/34* (2006.01)
*H01M 50/116* (2021.01)

(52) U.S. Cl.
CPC ....... *H01M 50/109* (2021.01); *H01M 50/116* (2021.01); *H01M 2220/30* (2013.01)

(56) References Cited

U.S. PATENT DOCUMENTS

| | | | |
|---|---|---|---|
| 2012/0015224 A1 | 1/2012 | Pytlik et al. | |
| 2012/0100406 A1 | 4/2012 | Gaugler | |
| 2012/0328915 A1* | 12/2012 | Hirose | H01M 4/366 429/61 |
| 2014/0131633 A1* | 5/2014 | Ito | C01G 51/56 252/519.15 |
| 2014/0315061 A1 | 10/2014 | Wang | |
| 2015/0270329 A1* | 9/2015 | Sagara | H01G 11/84 257/532 |

FOREIGN PATENT DOCUMENTS

| | | |
|---|---|---|
| EP | 3121865 B1 | 12/2017 |
| JP | 2002-216772 A | 8/2002 |
| WO | WO 2010/089152 A1 | 8/2010 |
| WO | WO 2010/146154 A2 | 12/2010 |

* cited by examiner

BATTERY AND PROCESS FOR PRODUCING A BATTERY

CROSS REFERENCE TO RELATED APPLICATIONS

This application claims benefit to European Patent Application No. EP 19175460.5, filed on May 20, 2019, which is hereby incorporated by reference herein.

FIELD

The present disclosure relates to a process for producing a battery and to a battery producible by the process.

BACKGROUND

Button cells usually have a cylindrical housing whose height is equal to its diameter or smaller than the latter. Very different electrochemical systems can be present in the housing. Very widespread cells are cells based on zinc/air, zinc/$MnO_2$ and nickel/zinc. Secondary (rechargeable) systems are also very widespread. Examples of these are nickel/metal hydride systems, nickel/cadmium systems and lithium ion systems.

Classically, the housing of button cells generally consists of two solid, metallic housing parts between which an electrically insulating seal is arranged. One of the housing parts is electrically connected to the positive electrode and is accordingly positively poled. The other is electrically connected to the negative electrode and is accordingly negatively poled. The seal is intended to prevent electric contact between the oppositely poled housing parts. In addition, it should counter escape and also intrusion of liquid or moisture from or into the housing. The housing parts are usually made of nickel-clad steel or of stainless steel.

In the case of a button cell based on lithium ions, the housing in many cases contains a composite body in the form of a cell stack which consists of a plurality of single cells. The cells often also contain a rolled composite body which is generally a single cell in rolled form. Button cells having rolled composite bodies based on lithium ions are described, for example, in WO 2010/146154 A2 and in WO 2010/089152 A1.

In the composite bodies, positive and negative electrodes and also separators are generally present in areal contact with one another. The electrodes and separators are, for example, joined to one another by lamination or by adhesive bonding. In general, composite bodies, regardless of whether they are rolled or not, comprise the sequence positive electrode/separator/negative electrode. As bicells, composite bodies are frequently produced with the possible sequences negative electrode/separator/positive electrode/separator/negative electrode or positive electrode/separator/negative electrode/separator/positive electrode.

The electrodes in the composite bodies usually in each case comprise a metallic current collector and also electrochemically active components (often referred to as active materials) and electrochemically inactive components.

The current collectors serve to establish electric contact over as large as possible an area with the electrochemically active components. They usually consist of tape-like, areal metallic substrates, for example metal foils or a metal sponge or a metallized nonwoven. In the case of cells based on lithium ions, the negative electrodes usually have a current collector composed of copper or of a copper alloy. The positive electrodes of cells based on lithium ions usually have a current collector composed of aluminium or of an aluminium alloy.

All materials which can take up lithium ions and release them again come into question as active materials for secondary lithium ion systems. Prior art materials for the negative electrode of secondary lithium ion systems are, in particular, materials based on carbon, for example graphitic carbon, or nongraphitic carbon materials capable of intercalating lithium. Possibilities for the positive electrode of secondary lithium ion systems are, for example, lithium-metal oxide compounds and lithium-metal phosphate compounds such as $LiCoO_2$ and $LiFePO_4$.

As electrochemically inactive components, mention may be made first and foremost of electrode binders and conductive materials. The electrode binders ensure the mechanical stability of the electrodes and ensure contact of the particles of electrochemically active material with one another and also with the current collector. Conductive materials such as carbon black serve to increase the electrical conductivity of the electrodes.

Possible separators for the abovementioned composite bodies are, in particular, tapes composed of porous polymer films, for example composed of a polyolefin or of a polyether ketone. Nonwovens and woven fabrics, in particular composed of these materials, can also be used.

End sections of the current collectors or current conductors welded onto the current collectors can serve to establish electrical contact between the electrodes and the housing parts of a button cell housing. In the case of button cells, the positive electrodes of the composite bodies are to be electrically connected to one of the two abovementioned housing parts of a button cell housing, and negative electrodes to the other of the housing parts.

The housing parts of a button cell generally each have a circular or oval bottom. In most cases, preference is given to joining the current collectors or the current conductors welded thereto to this bottom, in particular welding them to this bottom. This is not always unproblematic. Welded joins between different metals are sometimes difficult to form and electrochemically unstable. Consequently, process fluctuations and thus rejects can occur.

EP 3 121 865 B1 discloses covering the bottom of a housing part with a thin aluminium disc and welding the end section of a current collector composed of aluminium not directly to the housing bottom but to the aluminium disc. This is disadvantageous in so far as the aluminium disc reduces the available internal volume of the button cell housing described. In addition, the introduction of the aluminium disc increases the internal resistance.

SUMMARY

In an embodiment, the present invention provides a method for producing a battery. The method includes depositing, via sputter deposition, a coating on at least a portion of a cup shaped first housing part of the battery. The coating includes aluminium, chromium, tin, and/or an alloy having two or more of the group consisting of aluminium, chromium, and tin. The method also includes establishing an electrical connection between a current conductor of the battery and the cup-shaped first housing part of the battery and assembling the cup-shaped first housing part of the battery and a second housing part of the battery to form a housing of the battery. The housing has an interior space that includes a composite body including a positive electrode, a negative electrode, a separator, and the current conductor.

The cup-shaped first housing part has a circular or oval bottom and a ring-shaped side wall. The bottom and the side wall of the cup-shaped first housing part each have an inside facing the interior space of the housing and an outside facing in a direction opposite the interior space of the housing. The electrical connection between the current conductor and the cup-shaped first housing part electrically connects the positive electrode or the negative electrode to the cup-shaped first housing part.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1A:
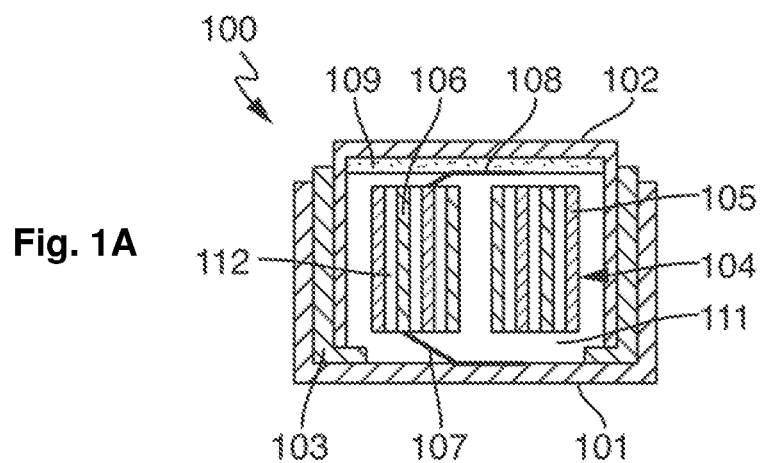
FIGS. 1A through 1D illustrate a battery according to an embodiment in cross section and components used in the assembly of the battery.
Figure 1B:
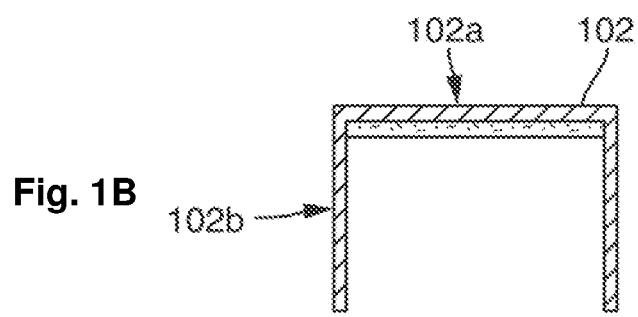
Figure 1C:
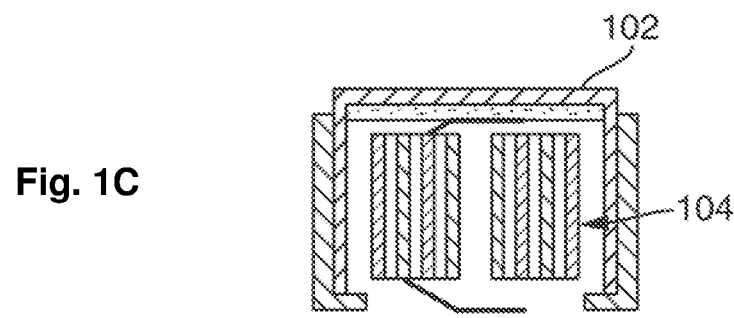
Figure 1D:
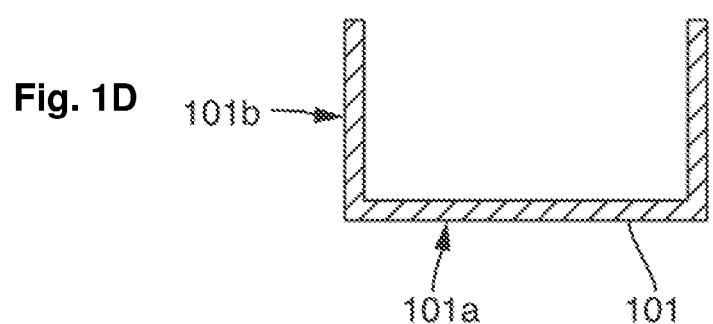

The present disclosure describes improved solutions for the electrical contacting of the electrodes of a battery with one of their housing parts.

A process according to the present disclosure serves to produce a battery which has the following features:
 a. it comprises a metallic housing enclosing an interior space and
 b. it comprises a composite body which is arranged in the interior space and is made up of at least one positive electrode, at least one negative electrode and at least one separator,
 c. the housing comprises a cup-shaped first housing part and a second housing part,
 d. the cup-shaped first housing part comprises a circular or oval bottom,
 e. the cup-shaped first housing part comprises a ring-shaped side wall,
 f. the bottom and the side wall of the cup-shaped first housing part each have an inside facing the interior space and an outside facing in the opposite direction, and
 g. the composite body comprises a current conductor which electrically connects the at least one positive electrode or the at least one negative electrode to the cup-shaped housing part.

The process comprises, in any order, the following steps:
 h. establishment of an electrical connection between the current conductor and the cup-shaped housing part.
 i. assembly of the first housing part and the second housing part to form the housing of the battery with inclusion of the composite body in the interior space.

In particular, the process is characterized in that before steps g. and h.:
 j. at least one of the specified insides of the cup-shaped housing part is provided in its entirety or in regions with a coating composed of aluminium, chromium, tin or an alloy of these elements by means of sputter deposition.

It has been found that significantly better welding results can be achieved by means of the coating. Thus, for example, a current conductor composed of aluminium can be welded very much more reliably to an aluminium-coated inside than to an inside composed of steel. In addition, the welded connection is also more electrochemically stable. As a result, the process stability is increased, and the impedance values of the batteries produced and also the current carrying capacity thereof are better than those of classically produced batteries.

In the present case, the application of the coating by means of sputter deposition is of particular importance. For the purposes of the present application, sputtering is the atomization of a solid surface (target) by bombardment with high-energy ions or neutral particles. Here, the kinetic energy of the ion or neutral particle is imparted by impacts to the atoms of the solid body. When a leader of the resulting impact cascade reaches the surface and sufficient energy is imparted to a surface atom in order to overcome the surface binding energy, this can leave the solid body as free particle. Emission of individual atoms, ions, sometimes also molecular clusters, occurs.

To effect sputter deposition, a substrate is brought close to the target so that the ejected atoms, ions and/or clusters can condense on the substrate and form a layer. Here, the gas pressure in the process chamber should be as low as possible (vacuum), so that the target atoms reach the substrate without colliding with gas particles. The process is ideally carried out in a high vacuum.

It would in principle be possible to make the first housing part from a steel sheet which has the coating of aluminium, chromium, tin or an alloy of these elements on one side in order to avoid the sputter deposition. However, the steel sheet would here be subjected to a deep drawing process in which the coating may acquire microcracks. In the sputter deposition following the deep drawing process, these problems are circumvented. In contrast, cracks, unevennesses and deformations which have arisen in the preceding production of the first housing part can even be covered over.

Quite generally, coatings having a particularly high quality can be produced by means of sputter deposition.

The housing and the housing parts of the battery, namely the cup-shaped first housing part and the second housing part, can, for example, be configured like the housing parts of the cell depicted in FIG. 1 of WO 2010/146154 A2. The battery can thus also be, in particular, a button cell.

A ring-shaped seal composed of polymer, which electrically insulates the housing parts from one another, is usually arranged between the two metallic housing parts. In addition, the seal should ensure liquid-tight closure of the housing.

The housing parts preferably consist of a steel, in particular a nickel-plated steel. In the latter case, the outside of the first housing part in particular and optionally also of the second housing part is/are nickel-plated. Furthermore, trimetal, for example with the sequence nickel, steel (or stainless steel) and copper, is also possible as metallic material.

The second housing part is particularly preferably configured with a cup shape like the first housing part, i.e. likewise has a circular or oval bottom and a ring-shaped side wall. In a further development, preference is given both in the case of the first housing part and in the case of the second housing part to the bottom and the ring-shaped side wall being joined to one another by means of a transition region.

The transition regions preferably comprise the regions of the housing parts which lie outside the plane of the respective bottom but are not yet part of the associated side wall region. The transition regions can be made rounded, for example shoulder-like, or else have the shape of a sharp edge.

The transition regions adjoin the side walls in each case in the direction of the bottom. On the other side, the side walls are in both cases preferably bounded by a circumferential free edge which defines a circular or oval opening.

The ring-shaped side walls of the housing parts have a cylindrical geometry in preferred embodiments. The side walls can particularly preferably include an angle of 90° with the bottom.

The basic structure of the composite body arranged in the interior space does not have to differ from composite bodies known from the prior art. Like the composite bodies mentioned at the outset, it consists of electrodes and at least one separator. In the case of a rolled composite body, the composite body can have a cylindrical or hollow-cylindrical geometry, for instance like the rolled composite bodies depicted in FIGS. 3a and 3b of WO 2010/146154 A2. The roll is then made of tape-like electrodes and at least one tape-like separator.

The composite body preferably comprises electrodes with the current collectors mentioned at the outset. These are preferably in each case a foil, a gauze, a mesh, a foam, a nonwoven or another textile structure composed of a metal or a metal alloy.

The current collectors preferably have at least one section which is not covered with an active material. This section can, in preferred embodiments, serve directly as current conductor which electrically connects the at least one positive electrode or the at least one negative electrode to the cup-shaped first housing part. As an alternative, the current conductor can also be a separate conductor which is, for example, welded to the section of the current collector which is not covered with the active material. In the latter case, the current conductor is preferably a metal foil.

The composite body particularly preferably comprises a current conductor which electrically connects the at least one positive electrode to the cup-shaped first housing part and a current conductor which electrically connects the at least one negative electrode to the second housing part.

As an alternative, it can also be preferred that the composite body comprises a current conductor which electrically connects the at least one negative electrode to the cup-shaped first housing part and a current conductor which electrically connects the at least one positive electrode to the second housing part.

To form the electrical connection between the current conductor and the cup-shaped housing part, the current conductor is preferably welded to the first housing part. When the current conductor is electrically connected to the at least one positive electrode, the current conductor which is electrically connected to the at least one negative electrode is preferably welded to the second housing part. Otherwise, the second housing part is connected to the at least one positive electrode.

When both housing parts have a cup-like shape, the assembly of the first and second housing parts is preferably effected by pushing the first housing part with the free edge of its side wall at the front into the second housing part, so that the ring-shaped side wall of the first housing part and the ring-shaped side wall of the second housing part overlap at least in regions and form a circumferential, double-walled side wall and the bottoms of the first and second housing parts are oriented parallel to one another. As an alternative, the second housing part with the free edge of its side wall at the front can also be pushed into the first housing part, so that the ring-shaped side wall of the first housing part and the ring-shaped side wall of the second housing part overlap at least in regions and form a circumferential, double-walled side wall and the bottoms of the first housing part and of the second housing part are oriented parallel to one another.

The dimensions of the first housing part and of the second housing part have to be appropriately matched to one another. The housing part which is to be pushed into the other usually has a side wall having a smaller diameter than the other housing part. The abovementioned ring-shaped seal composed of polymer is usually also pushed onto the side wall having the smaller diameter before the housing parts are assembled. Furthermore, the composite body is usually positioned in the housing part having the smaller side wall before the housing parts are assembled.

To close the housing, the free circumferential edge of the larger housing part can, in some embodiments, be bent inwards (crimping). However, crimping-free closure as is depicted, for example, in FIG. 1 of WO 2010/146154 A2 is also possible.

The establishment of the electrical connection can in principle occur before or after assembly. In the latter case, resistance welding or laser welding, for example, through the wall of the housing can be carried out.

In a preferred further development, the process is characterized by at least one of the steps a. to c. which directly follow:
a. The electrical connection between the current conductor and the cup-shaped housing part is formed in a region of the at least one inside which is provided with the coating.
b. The electrical connection is formed by means of welding.
c. The current conductor is welded to the inside of the bottom of the cup-shaped housing part.

The steps a., b. and c. directly above are particularly preferably realized in combination with one another. Particular preference is thus given to the inside of the bottom of the cup-shaped housing part being provided with the coating and the current conductor being welded to the coated bottom.

In another preferred further development, the process is characterized by at least one of the steps a. and b. which directly follow:
a. The inside of the bottom is provided over its entirety with the coating.
b. The inside of the side wall is provided in part with the coating.

The steps a. and b. directly above are particularly preferably realized in combination with one another. Thus, particular preference is given to the bottom being coated in its entirety and the side wall being coated only in part. To effect partial coating of the side wall, preference is given to coating a ring-shaped segment of the inside of the side wall.

In another preferred further development, the process is carried out by at least one of the steps a. and b. which directly follow:
a. The coating is applied with a uniform layer thickness to the inside of the bottom.
b. The layer thickness is set in the range from 10 nm to 10 μm.

The steps a. and b. directly above are particularly preferably realized in combination with one another. The layer thickness is very particularly preferably in the range from 100 nm to 2 μm.

In another preferred further development, the process is characterized by at least one of the steps a. and b. which directly follow:
  a. The coating is applied with a nonuniform layer thickness to the inside of the bottom.
  b. The layer thickness is set in the range from 10 nm to 10 µm.

The steps a. and b. directly above are particularly preferably realized in combination with one another. The layer thickness is very particularly preferably in the range from 10 nm to 5 µm.

The setting of a nonuniform layer thickness can be of importance both functionally and from a safety point of view. It can be functionally advantageous to make the coating thicker in the region in which the current conductor is to be welded on, or else make the coating deliberately rough in this region. From a safety point of view, nonuniform layer thicknesses can be of particular relevance when an undesirable mechanical reinforcement of the housing could occur.

In another preferred further development, the process is characterized by at least one of the steps a. and b. which directly follow:
  a. A cup-shaped housing part into the bottom of which an intended rupture position has been introduced is used.
  b. The intended rupture position is a bursting cross.

The steps a. and b. directly above are particularly preferably realized in combination with one another.

An intended rupture position in the housing serves the purpose of allowing impermissible overpressures to be dissipated. In order to be able to ensure this, the process is preferably carried out by the step a. which directly follows:
  a. The inside of the bottom is free of the coating in the region of the intended rupture position or the coating in this region has a lower thickness than in other regions of the bottom.

A battery according to the present disclosure results directly from the above-described process. It is accordingly characterized by the following features:
  a. it comprises a metallic housing enclosing an interior space,
  b. it comprises a composite body which is arranged in the interior space and is made up of at least one positive electrode, at least one negative electrode and at least one separator,
  c. the housing comprises a cup-shaped first housing part and a second housing part,
  d. the cup-shaped first housing part comprises a circular or oval bottom,
  e. the cup-shaped first housing part comprises a ring-shaped side wall,
  f. the bottom and the side wall of the cup-shaped first housing part each have an inside facing the interior space and an outside facing in the opposite direction, and
  g. the composite body comprises a current conductor which electrically connects the at least one positive electrode or the at least one negative electrode to the cup-shaped housing part.

In particular, the battery is characterized in that:
  h. a coating composed of aluminium, chromium, tin or an alloy of these elements has been applied to the entirety or regions of at least one of the insides by means of sputter deposition.

As regards preferred embodiments of the components of the battery, reference is made to the explanations in connection with the process described. Regardless of this, some particularly preferred features of the battery will be set forth again below:
  The electrodes of the battery are preferably configured so as to be able to incorporate and release lithium ions reversibly: the battery claimed is thus preferably a lithium ion battery, in particular a rechargeable lithium ion battery. It then correspondingly also has an electrolyte containing a lithium electrolyte salt.
  The electrodes preferably each comprise a current collector which is partly covered with an active material and/or the current conductor is preferably a part of the current collector which is not covered with the active material.
  At least the cup-shaped first housing part preferably consists of steel or stainless steel and/or the outside of the first cup-shaped housing part is covered with a layer of nickel.
  The second housing part is preferably configured with a cup shape like the first housing part and/or the battery is preferably a button cell.

In the past, the term battery has been used exclusively to refer to a plurality of electrochemical cells connected in series in a housing. However, single electrochemical cells are frequently also referred to as batteries today. This interpretation should also be applied in the present case. Even a button cell having only one positive electrode and one negative electrode will be referred to as battery for the purposes of the present patent application.

The battery is preferably a cylindrical button cell having an underside which is circular at least in one subregion and a upper side which is circular at least in a subregion and a ring-shaped side wall located inbetween. The distance between the upper side and the underside (height of the button cell) is preferably in the range from 4 mm to 15 mm. The maximum distance between two points on the side wall of the button cell (diameter of the button cell) is here preferably in the range from 5 mm to 25 mm. This is subject to the proviso that the maximum distance between the two points on the side wall is greater than the distance between upper side and the underside.

In further preferred embodiments, the battery is a cylindrical round cell having a housing with an underside which is circular and an upper side which is circular and a cylindrical side wall located inbetween. The distance between the upper side and the underside is preferably in the range from 10 mm to 100 mm. The maximum distance between two points on the side wall of the round cell is here preferably in the range from 5 mm to 20 mm. This is subject to the proviso that the maximum distance between the two points on the side wall is less than the distance between the upper side and the underside.

The nominal capacity of the battery is generally not more than 10000 mAh, in particular not more than 5000 mAh, in particular in the case that the battery is a cylindrical round cell. In the case of a button cell, the nominal capacity is preferably in the range from 50 mAh to 1000 mAh, particularly preferably in the range from 50 to 800 mAh.

In the European Union, manufacturers' indications concerning the nominal capacities of secondary batteries are strictly regulated. Thus, for instance, indications of nominal capacity of secondary nickel-cadmium batteries have to be based on measurements in accordance with the standards IEC/EN 61951-1 and IEC/EN 60622, indications of nominal capacity of secondary nickel-metal hydride batteries have to be based on measurements in accordance with the standard IEC/EN 61951-2, indications of the nominal capacity of secondary lithium ion batteries have to be based on measurements in accordance with the standard IEC/EN 61960 and indications of the nominal capacity of secondary lead-acid batteries have to be based on measurements in accordance with the standard IEC/EN 61056-1. All indications of nominal capacities in the present application are preferably likewise based on these standards.

When the battery is a rechargeable lithium ion battery, it is preferably characterized by at least one of the features a. to c. which directly follow:
  a. The current conductor consists of aluminium or of an aluminium alloy.
  b. The current conductor consists of copper or of a copper alloy.
  c. The current conductor is based on the same metal as the coating on the at least one inside.

The features a. and c. and also b. and c. directly above are particularly preferably realized in combination with one another.

The current conductor is ideally based on the same metal as the current collector to which it is connected. In the case of lithium ion batteries, current collectors of the positive electrode frequently consist of aluminium or an aluminium alloy, while current collectors for the negative electrode preferably consist of copper or a copper alloy.

Further features, details and preferred aspects of the invention may be derived from the following description of preferred embodiments and also with the aid of the drawings.

The battery 100 having the features depicted in FIG. 1A has a housing which is made up of the first housing part 102 and the second housing part 101. The two housing parts 102 and 101 consist of steel. They are both cup-shaped. The housing part 102 comprises the circular bottom 102a and the ring-shaped side wall 102b. The housing part 101 comprises the circular bottom 101a and the ring-shaped side wall 101b.

The seal 103 which seals the housing is arranged between the housing parts 102 and 101. The housing encloses an interior space 111 in which the composite body 104 is arranged. The latter is made of the positive electrode 105, the negative electrode 106 and the separator 112 and is present as roll. The end faces of the roll point in the direction of the bottoms 102a and 101a.

The electrodes 105 and 106 each comprise a current collector which is predominantly covered with an active material and is therefore not visible in large parts, apart from the subregions 107 and 108 which are not covered with active material. These subregions 107 and 108 in the present case function as current conductors. The current conductor 108 connects the positive electrode 105 to the cup-shaped first housing part 102. The negative electrode 106 is connected via the current conductor 107 to the second housing part 101. The collector for the negative electrode 106 and thus the current conductor 107 is a copper foil. The collector for the positive electrode 105 and thus the current conductor 108 is an aluminium foil.

The bottom 102a has the coating 109 composed of aluminium on its inside. This coating was applied by means of sputter deposition. The coating 109 has a uniform layer thickness which is 10 μm. The inside of the bottom 102a is provided in its entirety with the coating 109.

The current conductor 108 is connected by welding to the coated inside of the bottom 102a of the cup-shaped housing part 102. The current conductor 107 is connected to the inside of the bottom 101a of the housing part 101, likewise by welding.

To produce the battery 100, this housing part 102 provided with the coating 109 (depicted in FIG. 1B), the housing part 101 (depicted in FIG. 1D) and the composite body 104 (depicted in FIG. 1C) are assembled. The composite body 104 is for this purpose pushed into the housing part 102, and the seal 103 is pulled onto the side wall 102b. The welding-on of the current conductor 108 is preferably carried out before closure of the housing. For example, an electrode can for this purpose be conducted through the centre of the composite body 104 and the current conductor 108 can be fixed to the bottom 102a by resistance welding. The current conductor 107 can, if it is of sufficient length, be welded onto the bottom 101a before closure of the housing. Otherwise, welding-on after closure of the housing is in principle also possible, as is described, for example, in WO 2010/146154 A2.

Some preferred embodiments of a housing part of a battery are shown in FIG. 2.

Figure 2A:
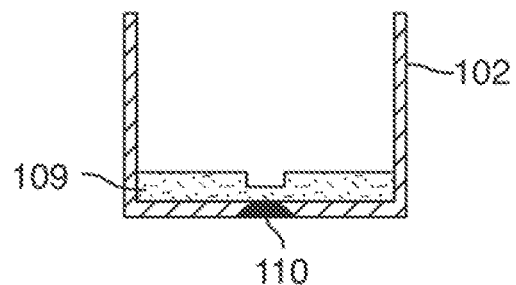
FIGS. 2A through 2C illustrate embodiments of a housing part of a battery (likewise depicted in cross section).

While the bottom 102a of the housing part 102 depicted in FIG. 1 is coated with a uniform thickness of aluminium, the coating 109 in FIG. 2A has a nonuniform layer thickness. The housing part 102 depicted here has an intended rupture position 110. In the region of the intended rupture position 110, the coating 109 has a lower thickness than in other regions of the bottom 102a.

Figure 2B:
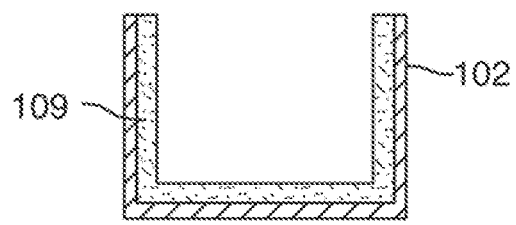

In the case of the housing part depicted in FIG. 2B, not only is the bottom 102a coated with aluminium but instead the side wall 102b is also coated on the inside with the coating.

Figure 2C:
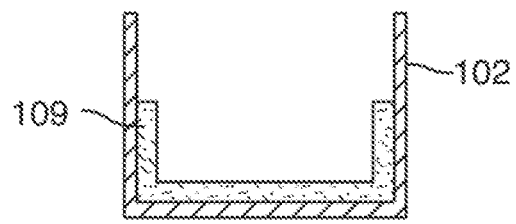

In the case of the housing part depicted in FIG. 2C, the bottom 102a is coated with aluminium. In addition, a ring-shaped section of the inside of the side wall 102b is coated with the coating.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A battery, comprising:
  a metallic housing enclosing an interior space, the housing including a cup-shaped first housing part and a second housing part; and a composite body arranged in the interior space, the composite body including a positive electrode, a negative electrode, a separator, and a current conductor that electrically connects the cup-shaped first housing part either to the positive electrode or to the negative electrode, wherein the cup-shaped first housing part has a circular or oval bottom and a ring-shaped side wall, wherein the bottom of the cup-shaped first housing part and the side wall of the cup-shaped first housing part each have an inside facing the interior space of the housing and an outside facing in a direction opposite the interior space of the housing, and wherein at least a portion of the inside of the bottom of the cup-shaped first housing part and/or at least a portion of the inside of the side-wall of the cup-shaped first housing part include a sputter-deposited coating, the sputter-deposited coating including aluminium, chromium, tin, and/or an alloy having two or more of the group consisting of aluminium, chromium, and tin.

2. The battery according to claim 1, wherein the composite body includes the electrodes in stacked form or in rolled form, and wherein the electrodes are configured so as to be able to reversibly incorporate and release lithium ions.

3. The battery according to claim 1, wherein electrodes each comprise a current collector which is partly covered with a respective active material, and wherein the current conductor is a part of one of the current collectors is not covered with the respective active material.

4. The battery according to claim 1, wherein the cup-shaped first housing part includes steel or stainless steel, and wherein the outside of the cup-shaped first housing part is covered with a layer of nickel.

5. The battery according to claim 1, wherein the current conductor includes aluminium or an aluminium alloy, wherein the coating is based on a same metal as the current conductor, and wherein the battery includes a second current conductor including copper or a copper alloy.

6. The battery according to claim 1, wherein second housing part has a cup-shaped configuration, and wherein the battery is a button cell and the metallic housing is a metallic button cell housing.

7. The battery according to claim 6 wherein the battery is a rechargeable lithium ion battery, the battery further comprising:

a non-aqueous electrolyte comprising a lithium electrolyte salt.

8. The battery according to claim 6, wherein the current conductor electrically connects the cup-shaped first housing part to the positive electrode or the negative electrode via a weld, the weld being formed in a region of the portion of the inside of the bottom of the cup-shaped first housing part that includes the sputter-deposited coating.

9. The battery according to claim 6, wherein the sputter-deposited coating is disposed over an entirety of the inside of the bottom of the cup-shaped first housing part and over at least a portion of the inside of the side wall of the cup-shaped first housing part.

10. The battery according to claim 6, wherein the bottom of the cup-shaped first housing part includes an intended rupture region.

11. The battery according to claim 10, wherein the sputter deposited coating has a non-uniform thickness, the non-uniform thickness being in a range of 10 nm to 10 μm.

12. The battery according to claim 11, wherein the sputter deposited coating has a first thickness in the intended rupture region and a second thickness outside of the intended rupture region, wherein a maximum thickness of the first thickness is less than a minimum thickness of the second thickness.

13. The battery according to claim 6, wherein the sputter deposited coating has a uniform layer thickness, the layer thickness being in a range of 10 nm to 10 μm.

* * * * *